United States Patent
Liu et al.

(10) Patent No.: US 11,233,526 B2
(45) Date of Patent: Jan. 25, 2022

(54) TWO-DIMENSIONAL SQUARE CONSTRAINT ENCODING AND DECODING METHOD AND DEVICE

(71) Applicant: WUHAN FIBERHOME TECHNICAL SERVICES CO., LTD., Hubei (CN)

(72) Inventors: Jibin Liu, Hubei (CN); Ming Wei, Hubei (CN)

(73) Assignee: WUHAN FIBERHOME TECHNICAL SERVICES CO., LTD., Hubei (CN)

( * ) Notice: Subject to any disclaimer, the term of this patent is extended or adjusted under 35 U.S.C. 154(b) by 0 days.

(21) Appl. No.: 17/055,534

(22) PCT Filed: Sep. 11, 2019

(86) PCT No.: PCT/CN2019/105376
§ 371 (c)(1),
(2) Date: Nov. 13, 2020

(87) PCT Pub. No.: WO2021/046756
PCT Pub. Date: Mar. 18, 2021

(65) Prior Publication Data
US 2021/0367612 A1    Nov. 25, 2021

(51) Int. Cl.
*H03M 7/00* (2006.01)
*H03M 7/30* (2006.01)

(52) U.S. Cl.
CPC ....... *H03M 7/3066* (2013.01); *H03M 7/6005* (2013.01); *H03M 7/6011* (2013.01)

(58) Field of Classification Search
CPC ............. H03M 7/3066; H03M 7/6011; H03M 7/6005; H03M 7/00
USPC ...................................... 341/50, 51
See application file for complete search history.

(56) References Cited

U.S. PATENT DOCUMENTS

| 5,907,581 | A | * | 5/1999 | Ashley | ..................... H03M 5/04 375/242 |
| 7,286,064 | B2 | * | 10/2007 | Immink | ............. G11B 20/1426 341/58 |
| 8,341,502 | B2 | * | 12/2012 | Steiner | .............. H03M 13/2927 714/774 |

(Continued)

*Primary Examiner* — Jean B Jeanglaude
(74) *Attorney, Agent, or Firm* — Chun-Ming Shih; Lanway IPR Services

(57) ABSTRACT

A two-dimensional square constraint encoding and decoding method and device, relating to the fields of data storage and data communication. The encoding method includes caching a one-dimensional data stream, and dividing the one-dimensional data stream into several sets of one-dimensional 2-bit data; according to an encoding table, encoding each set of 2-bit data into a 3*2 two-dimensional codeword in sequence by an encoder, and then cascading all the two-dimensional codewords into a two-dimensional constraint array in a specified order; the decoding method includes reading the two-dimensional constraint array by a decoder, and dividing the two-dimensional constraint array into several 3*2 two-dimensional codewords; decoding each two-dimensional codeword into the one-dimensional 2-bit data in sequence through a decoding table, and then successively assembling the generated one-dimensional 2-bit data into the one-dimensional data stream and outputting.

12 Claims, 7 Drawing Sheets

(56) References Cited

U.S. PATENT DOCUMENTS

| | | | | |
|---|---|---|---|---|
| 8,700,970 B2 * | 4/2014 | Steiner | ............. | H03M 13/2918 |
| | | | | 714/755 |
| 8,957,792 B2 * | 2/2015 | Liu | ........................ | H03M 7/46 |
| | | | | 341/59 |
| 2007/0030912 A1 * | 2/2007 | Immink | ................ | H03M 5/145 |
| | | | | 375/242 |
| 2007/0290901 A1 * | 12/2007 | Hekstra | ............. | G11B 20/1426 |
| | | | | 341/95 |
| 2011/0214029 A1 * | 9/2011 | Steiner | ............. | H03M 13/2927 |
| | | | | 714/746 |
| 2011/0214039 A1 * | 9/2011 | Steiner | ............. | H03M 13/2927 |
| | | | | 714/797 |
| 2014/0104083 A1 * | 4/2014 | Liu | ...................... | H03M 5/145 |
| | | | | 341/59 |

* cited by examiner

TWO-DIMENSIONAL SQUARE CONSTRAINT ENCODING AND DECODING METHOD AND DEVICE

FIELD OF THE INVENTION

The present invention belongs to the field of data storage and data communication, and specifically relates to a two-dimensional square constraint encoding and decoding method and device, wherein in a binary data array composed of "0" and "1" on a plane composed of a quadrilateral grid, data "1" cannot be directly adjacent to each other along the horizontal, vertical, northeast and southeast directions.

BACKGROUND OF THE INVENTION

In a modern memory, the directly adjacent data stored on the recording medium will cause intersymbol interference due to mutual influence. In order to reduce the possibility of data errors and improve the reliability of the memory system, data recording on the storage medium usually needs to meet certain restrictions, that is, the data needs to be encoded into some patterns that meet special constraints and restrictions before it can be stored on the recording medium. Constraint patterns vary with different applications. The common constraint types comprise a maximum transition run constraint (MTR), a run-length limitation constraint and other constraints.

Data access along one-dimensional tracks of the recording medium is a common storage technology at present. In recent years, with increasing demand and technological progress, the next-generation data storage technology that accesses data in two-dimensional pages (or even three-dimensional) has been significantly developed for the purpose of increasing data transmission rate and storage capacity. Related examples comprise a phase change memory (PCM), a holographic memory, a two-dimensional optical disc, a two-dimensional patterned media recording, etc. In the above-mentioned storage technology, the data is arranged and combined into a two-dimensional data array in a quadrilateral grid or hexagonal grid on a two-dimensional plane, and the intersymbol interference becomes more complex and has changed from a one-dimensional situation to a two-dimensional situation. In addition to consider the mutual influence of intersymbol interference on the data in the left and right directions of "horizontal", the mutual influence on adjacent data in the "vertical" direction also needs to be considered. In some specific applications, in order to avoid the direct influence between the data "1", it is required that the data "1" cannot be directly adjacent to each other in four directions in the two-dimensional data array, which is commonly referred to as a two-dimensional square constraint. Specifically, taking the quadrilateral grid as an example, the two-dimensional square constraint means that in the two-dimensional data array composed of data "0" and data "1", the two data "1" cannot be directly adjacent in the horizontal direction, the vertical direction, the northeast direction and the southeast direction. That is to say, in the binary data pattern recorded on the storage medium, the pattern combination shown in FIG. 1 cannot appear.

In the above-mentioned two-dimensional square constraint, in the storage technology that accesses data along one-dimensional tracks (such as optical recording and magnetic recording), in the recorded data sequence, any two data "1" cannot be directly adjacent. Traditionally, a solution to this problem is to adopt a one-dimensional run-length limited (1, ∞) (RLL) encoding method. However, in the above-mentioned data accessing technology according to two-dimensional pages, the limitation of the direct neighbor constraint between the data "1" is reflected in 4 directions, and the one-dimensional (1, ∞) RLL encoding method that can only solve the horizontal direction is obviously powerless here.

SUMMARY OF THE INVENTION

In view of the defects in the prior art, the purpose of the present invention is to provide a two-dimensional square constraint encoding and decoding method and device based on a quadrilateral grid, so that in a binary data array composed of data "0" and "1", along the four directions of horizontal, vertical, northeast, and southeast, data "1" cannot be directly adjacent to each other.

In order to achieve the above purpose, on the one hand, adopting a two-dimensional square constraint encoding and decoding method, the encoding method comprises: caching a one-dimensional data stream, and dividing the one-dimensional data stream into several sets of one-dimensional 2-bit data; through looking up an encoding table of a two-dimensional square constraint encoder, encoding each set of 2-bit data into a 3*2 two-dimensional codeword in sequence, and constructing all the two-dimensional codewords obtained by encoding into a two-dimensional constraint array with a size equal to one page in an encoding sequence; data "1" being not directly adjacent to each other along four directions of a horizontal direction, a vertical direction, a northeast direction and a southeast direction of the two-dimensional constraint array;

the decoding method comprises: reading the two-dimensional constraint array, and dividing the two-dimensional constraint array into several 3*2 two-dimensional codewords in a specified order, by taking advantage of an internal relationship that the decoding output of the current two-dimensional codeword is not only directly related to the current two-dimensional codeword, but also related to the previous two-dimensional codeword or the next two-dimensional codeword, decoding each two-dimensional codeword into a set of one-dimensional 2-bit data in sequence through looking up a decoding table of a two-dimensional square constraint decoder, and then successively assembling all the one-dimensional 2-bit data into a one-dimensional data stream and outputting.

Preferably, the encoder comprises two states, which are respectively called a first state and a second state; and the encoding basis of the encoding table is:

the 3*2 two-dimensional codeword output by the current encoding is determined by the currently input one-dimensional 2-bit data and the next set of input one-dimensional 2-bit data and the current state of the encoder; the next state of the encoder, which is the output state of the encoder, is determined by the current state of the encoder, the currently input one-dimensional 2-bit data and the next set of input one-dimensional 2-bit data.

Preferably, the one-dimensional 2-bit data are respectively 00, 10, 01, and 11, basic two-dimensional codewords are respectively $$\begin{matrix} 00 & 00 & 00 & & 00 \\ 10, & 00, & 01 & \text{and} & 00, \\ 00 & 10 & 00 & & 01 \end{matrix}$$

each set of one-dimensional 2-bit data corresponds to a basic two-dimensional codeword, and the corresponding relationship is set arbitrarily.

Preferably, when the one-dimensional 2-bit data of 00, 10, 01 and 11 respectively correspond to the basic two-dimensional codewords of $$\begin{matrix} 00 & 00 & 00 & 00 \\ 10, & 00, & 01 & \text{and} & 00, \\ 00 & 10 & 00 & 01 \end{matrix}$$

if the current 2-bit data and the next set of 2-bit data show four conditions as 0100, 1100, 0110 and 1110, the basic two-dimensional codeword combinations corresponding to the current 2-bit data and the next set of 2-bit data should be respectively replaced with the following combinations:

$$\begin{matrix} 0000 & 0000 & 0000 & 0000 \\ 0100, & 0000, & 1000 & \text{and} & 0000. \\ 0000 & 0100 & 0000 & 1000 \end{matrix}$$

Preferably, the encoding table of the encoder is:

| Current state | Data | Look-ahead data | Next state | Output codeword |
|---|---|---|---|---|
| 1 | 00 | — | 1 | 00 10 00 |
| 2 | | | | 00 00 00 |
| 2 | 01 | 00 | 2 | 00 01 00 |
|   |    | 01, 11 | 1 | |
| 1 | 10 | | 2 | 00 10 00 |
| 1 | 10 | — | 1 | 00 00 10 |
| 2 | | | | 00 00 00 |
| 1 | 11 | 00 | 2 | 00 00 01 |
|   |    | 01, 11 | 1 | |
| 2 | | 10 | 2 | 00 00 10 |

Preferably, the decoding table of the decoder is:

| Current codeword | Previous codeword | Next codeword | Output bit |
|---|---|---|---|
| 00 01 00 | — | — | 01 |
| 00 00 01 | — | — | 11 |
| 00 10 00 | — | 00 00 00 | 01 |
| — | — | 00 00 00 00, 10, 00, 01 01 00 10 00 | 00 |
| 00 00 10 | — | 00 00 00 | 11 |
| — | — | 00 00 00 00, 10, 00, 01 10 00 01 00 | 10 |
| 00 00 00 | 00 00 00, 01 01 00 | — | 00 |
| 00 00 10 00 00 10 | — | — | 10 |
| 00 00 00 | — | — | X | wherein X indicates non-emergence.

Preferably, the one-dimensional 2-bit data are respectively 00, 10, 01 and 11, basic two-dimensional codewords are respectively $$\begin{matrix} 00 & 10 & 00 & 01 \\ 10, & 00, & 01 & \text{and} & 00, \\ 00 & 00 & 00 & 00 \end{matrix}$$

each one-dimensional 2-bit data corresponds to a basic two-dimensional codeword, and the corresponding relationship is set arbitrarily.

Preferably, when the one-dimensional 2-bit data of 00, 10, 01 and 11 respectively correspond to the basic two-dimensional codewords of $$\begin{matrix} 00 & 10 & 00 & 01 \\ 10, & 00, & 01 & \text{and} & 00, \\ 00 & 00 & 00 & 00 \end{matrix}$$

if the current 2-bit data and the next set of 2-bit data show four conditions as 0100, 1100, 0110 and 1110, the basic two-dimensional codeword combinations corresponding to the current 2-bit data and the next set of 2-bit data should be respectively replaced with the following combinations:

$$\begin{matrix} 0000 & 0100 & 0000 & 1000 \\ 0100, & 0000, & 1000 & \text{and} & 0000. \\ 0000 & 0000 & 0000 & 0000 \end{matrix}$$

Preferably, the encoding table of the encoder is:

| Current state | Data | Look-ahead data | Next state | Output codeword |
|---|---|---|---|---|
| 1 | 00 | — | 1 | 00 |
|   |    |   |   | 10 |
|   |    |   |   | 00 |
| 2 |    |   |   | 00 |
|   |    |   |   | 00 |
|   |    |   |   | 00 |
| 2 | 01 | 00 | 2 | 00 |
|   |    | 01, 11 | 1 | 01 |
|   |    |   |   | 00 |
| 1 |    | 10 | 2 | 00 |
|   |    |   |   | 10 |
|   |    |   |   | 00 |
| 1 | 10 | — | 1 | 10 |
|   |    |   |   | 00 |
|   |    |   |   | 00 |
| 2 |    |   |   | 00 |
|   |    |   |   | 00 |
|   |    |   |   | 00 |
| 1 | 11 | 00 | 2 | 01 |
|   |    | 01, 11 | 1 | 00 |
|   |    |   |   | 00 |
| 2 |    | 10 | 2 | 10 |
|   |    |   |   | 00 |
|   |    |   |   | 00 |

Preferably, the decoding table of the decoder is:

| Current codeword | Previous codeword | Next codeword | Output bit |
|---|---|---|---|
| 00<br>01<br>00 | — | — | 01 |
| 01<br>00<br>00 | — | — | 11 |
| 00<br>10<br>00 | — | 00<br>00<br>00 | 01 |
| — | | 01 00 10 00<br>00, 10, 00, 01<br>00 00 00 00 | 00 |
| 10<br>00<br>00 | — | 00<br>00<br>00 | 11 |
| — | | 01 00 10 00<br>00, 10, 00, 01<br>00 00 00 00 | 00 |
| 00<br>00<br>00 | 01 00<br>00, 01<br>00 00 | — | 00 |
| 00 10<br>10, 00<br>00 00 | | — | 10 |
| 00<br>00<br>00 | — | | X | wherein X indicates non-emergence.

Preferably, in the encoding method, cascading the two-dimensional codewords obtained by encoding from left to right and from top to bottom;

in the decoding method, dividing the two-dimensional constraint array into several 3*2 two-dimensional codewords from left to right and from top to bottom; and the decoder decodes the current two-dimensional codeword in sequence through using a sliding-block decoding method.

In addition, the present invention further provides an encoding and decoding device suitable for the above encoding and decoding method, and the encoding device comprising:

a one-dimensional data stream caching component, which is configured to cache a one-dimensional data stream according to a code rate and the size of a two-dimensional data page;

a data stream dividing component, which is configured to divide the one-dimensional data stream cached by the one-dimensional data stream caching component into several sets of one-dimensional 2-bit data;

a square constraint codeword encoder, which is configured to read the one-dimensional 2-bit data from the data stream dividing component, and encode each set of 2-bit data into a 3*2 two-dimensional codeword in sequence according to an encoding table;

a two-dimensional data array assembling component, which is configured to cache all two-dimensional codewords generated by the square constraint codeword encoder, and cascade from left to right and from top to bottom according to the encoding sequence to construct a two-dimensional constraint array with a size equal to one page; further configured to output the two-dimensional data of the page constructed to a two-dimensional data recording device;

the decoding device comprises:

a two-dimensional data array caching component, which is configured to cache a two-dimensional constraint array of the page output by the two-dimensional data recording device;

a two-dimensional codeword dividing component, which is configured to divide the two-dimensional constraint array into several 3*2 two-dimensional codewords in a specified order;

a square constraint codeword decoder, which is configured to, according to the principle of sliding-block decoding, by taking advantage of an internal relationship that the decoding output of the current two-dimensional codeword is not only directly related to the current two-dimensional codeword, but also related to the previous two-dimensional codeword or the next two-dimensional codeword, decode each two-dimensional codeword into a set of one-dimensional 2-bit data in sequence through looking up the decoding table of the two-dimensional square constraint decoder;

a one-dimensional data stream assembling component, which is configured to successively assemble all the one-dimensional 2-bit data output by the square constraint codeword decoder into the one-dimensional data stream for output.

The above-mentioned technical solutions have the following beneficial effects.

1. In the present invention, in the encoding stage, the encoder adopts a look-ahead encoding method, which can encode a one-dimensional data stream into a two-dimensional data array that satisfies the two-dimensional square constraint; in the decoding stage, the decoder adopts a sliding-block decoding principle, which can recover the original data from the two-dimensional data array stored on the recording medium and meeting the two-dimensional square constraint. The two-dimensional square constraint of the present invention is sometimes referred to as the Non-Attacking-King (NAK) in some documents. The technical solution proposed by the present invention can be applied to a data storage system that records in the form of a two-dimensional data array ("page" surface mode), or a communication system that transmits data in a two-dimensional array type.

2. In the encoding stage, the current 2-bit data is encoded into a 3*2 two-dimensional codeword through looking ahead a 2-bit data and combing with the current state of the encoder; in the decoding stage, the sliding-block decoding principle is adopted to realize the decoding of the current 3*2 two-dimensional codeword. Since the data and the two-dimensional codeword are relatively short, it is beneficial to simplify the circuit design and specific implementation of the encoding and decoding device. In addition, since the capacity of the two-dimensional square constraint is approximately equal to 0.42508, the encoding efficiency is close to 80% in the present invention, which is of great significance for improving the overall performance of the storage channel and the communication channel.

3. A two-state finite state encoder is adopted in the encoding and decoding device, and the state of the encoder is reduced to a minimum through simplification. Although the decoding window of the decoder is equal to the length of three two-dimensional codewords, in fact, for the decoding of each two-dimensional codeword, the decoding window is only two two-dimensional codewords in length, so the disastrous error propagation caused by decoding errors is limited to 4 bits data.

DETAILED DESCRIPTION OF THE EMBODIMENTS

In order to make the purposes, technical solutions and advantages of the present invention clearer, the present invention will be further described below in detail with reference to the drawings in combination with the embodiments. It should be understood that the specific embodiments described here are only used to explain the present invention, but not to limit the scope of the present invention. In addition, the technical features involved in the various embodiments of the present invention described below can be combined with each other.

An embodiment provides a two-dimensional square constraint encoding and decoding method, which comprises an encoding method and a decoding method, and the encoding method comprises:

S101, caching a one-dimensional data stream according to a code rate and the size of a two-dimensional data page, and then dividing the cached one-dimensional data stream into several sets of data words with 2-bit as a data word.

Figure 1:
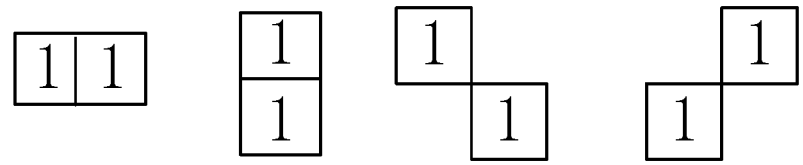
FIG. 1 shows four types of prohibited two-dimensional data pattern combinations described in a two-dimensional square constraint of the present invention.

S102, through an encoding table of a two-dimensional square constraint encoder, encoding each set of 2-bit data into a 3*2 two-dimensional codeword in sequence, and cascading all the two-dimensional codewords obtained by encoding to form a two-dimensional constraint array, along four directions of a horizontal direction, a vertical direction, a northeast direction and a southeast direction as shown in FIG. 1, the data "1" being not directly adjacent to each other. The current state of the encoder comprises two states, which are respectively called a first state and a second state.

Figure 2:
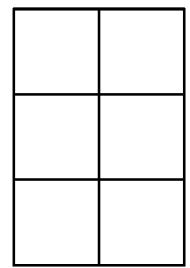
FIG. 2 shows a two-dimensional codeword composed of a 3*2 data array of the present invention.

As shown in FIG. 2, the two-dimensional codeword adopted in the embodiment is a two-dimensional array with 3 bits high and 2 bits long, which is the smallest access unit in the process of actually accessing two-dimensional data.

Figure 3:
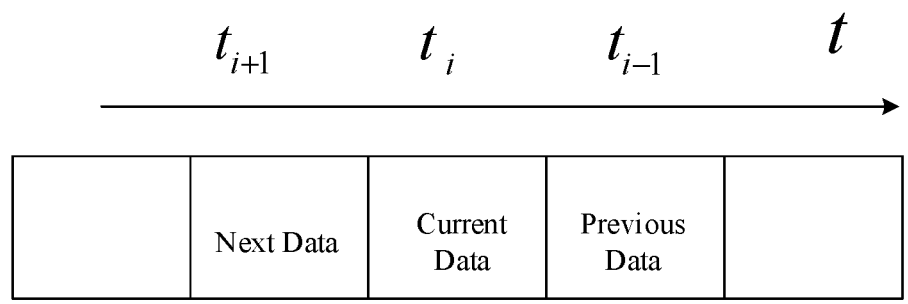
FIG. 3 shows a schematic diagram of a timing relationship when reading data of the present invention.
Figure 4:
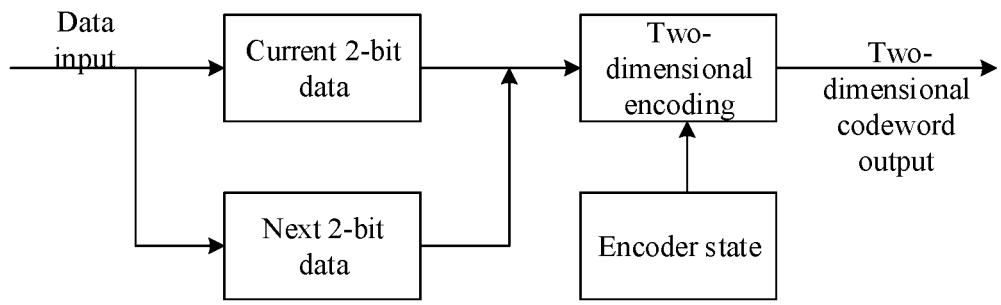
FIG. 4 shows a schematic diagram of an encoding principle of looking ahead a data of the present invention.

In the specific encoding process, the timing relationship between the read 2-bit data is shown in FIG. 3, wherein $t_{i+1}$ represents the next time of the data, $t_i$ represents the current time of the data, and $t_{i-1}$ represents the previous time. As shown in FIG. 4, when the encoder needs to encode the 2-bit data input at time $t_i$, the encoder performs two-dimensional encoding according to the one-dimensional 2-bit data and the next set of input 2-bit data (look-ahead data), and the current state of the encoder, and then outputs the encoded two-dimensional codeword. On the other hand, the next state of the encoder (i.e. the output state) is updated in real time according to Table 3 (or Table 7), based on the current state of the encoder, the current input one-dimensional 2-bit data and the next set of input one-dimensional 2-bit data (look-ahead data). The next state after the update is taken as the current state of the encoder at time $t_{i+1}$.

S103. after constructing a two-dimensional constraint array with a size equal to one page from all the two-dimensional codewords in a specified order, outputting the two-dimensional constraint array to a two-dimensional data recording device.

Figure 5:
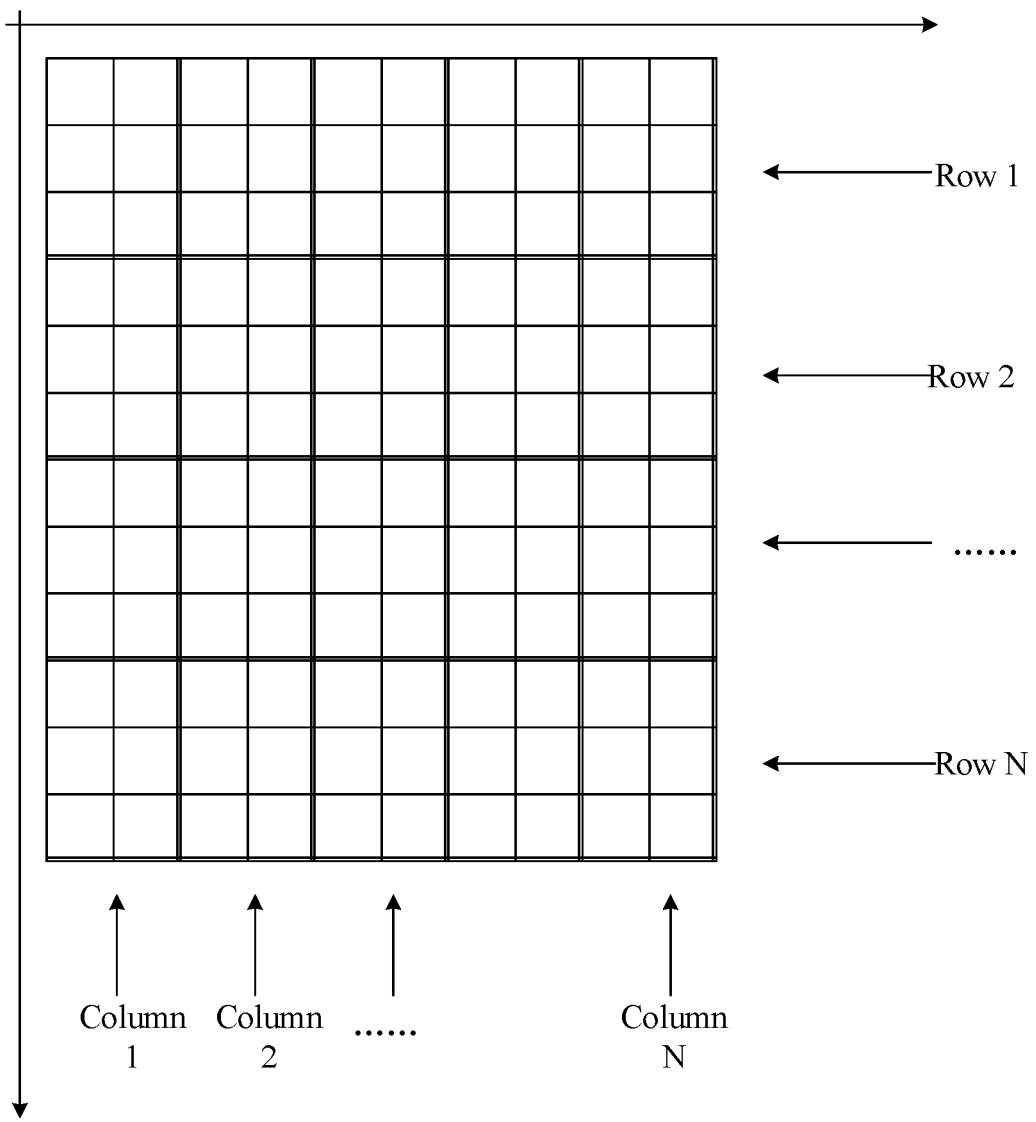
FIG. 5 shows a layout diagram of a two-dimensional codeword in a data array of the present invention.

As shown in FIG. 5, it is a layout diagram of the two-dimensional codeword in the data array. The layout diagram illustrates that when one-dimensional user data is written in a two-dimensional array method, from the perspective of the smallest access unit of a 3*2 two-dimensional array, the data is cascaded in a row-by-row manner from left to right and from top to bottom.

The decoding method in the present embodiment comprises:

reading the two-dimensional constraint array from the two-dimensional data recording device, and dividing the two-dimensional constraint array into several 3*2 two-dimensional codewords in a specified cascading order, that is, dividing according to the minimum access unit. In the embodiment, as shown in FIG. 5, the division is performed row by row from left to right and from top to bottom.

Figure 6:
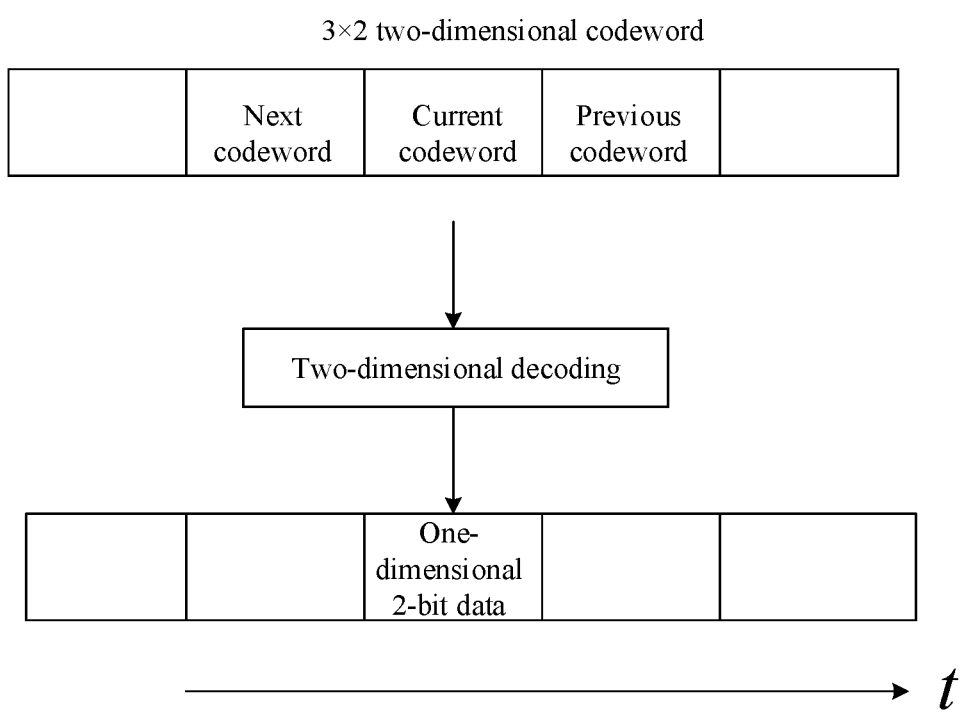
FIG. 6 show a schematic diagram of a sliding-block decoding principle of the present invention.

As shown in FIG. 6, the decoder decodes the two-dimensional codeword in sequence by way of sliding-block decoding. By taking advantage of the decoding table of the two-dimensional square constraint decoder and in combination with the current two-dimensional codeword and the next two-dimensional codeword, the decoder decodes each two-dimensional codeword into the one-dimensional 2-bit data in sequence, and successively assembles all the one-dimensional 2-bit data obtained by decoding into a one-dimensional data stream and outputs the one-dimensional data stream.

In the above encoding method, a basic two-dimensional codeword or an alternative codeword needs to be used to encode the 2-bit data. The one-dimensional 2-bit data comprises 00, 10, 01, and 11. In this embodiment, Table 1 is a basic code table.

TABLE 1

| Data | Codeword | Data | Codeword |
|------|----------|------|----------|
| 00   | 00       | 10   | 00       |
|      | 10       |      | 00       |
|      | 00       |      | 10       |

TABLE 1-continued

| Data | Codeword | Data | Codeword |
|------|----------|------|----------|
| 01   | 00       | 11   | 00       |
|      | 01       |      | 00       |
|      | 00       |      | 01       |

On the basic of Table 1, the above-mentioned one-dimensional 2-bit data can be encoded into a 3*2 two-dimensional codeword, and the above four 3*2 two-dimensional codewords can be horizontally cascaded in pairs to form sixteen types of 3*4 two-dimensional arrays, of which four situations violate the two-dimensional square constraint limitation, namely:

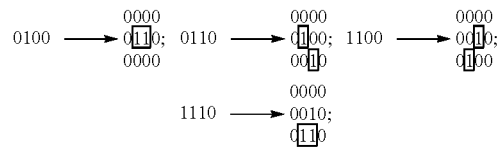

When table 1 is taken to encode the data, the four counter examples are replaced with the corresponding codeword combination in the substitute code table 2 if the above situations occur.

TABLE 2

| Data | Codeword | Data | Codeword |
|------|----------|------|----------|
| 0100 | 0000     | 1100 | 0000     |
|      | 0100     |      | 0000     |
|      | 0000     |      | 0100     |
| 0110 | 0000     | 1110 | 0000     |
|      | 1000     |      | 0000     |
|      | 0000     |      | 1000     |

According to the above Tables 1 and 2, the encoding table 3 can be constructed and the encoder can perform encoding by looking up Table 3.

TABLE 3

| Current state | Data | Look-ahead data | Next state | Output codeword |
|---------------|------|-----------------|------------|-----------------|
| 1             | 00   | —               | 1          | 00              |
|               |      |                 |            | 10              |
|               |      |                 |            | 00              |
| 2             |      |                 |            | 00              |
|               |      |                 |            | 00              |
|               |      |                 |            | 00              |
| 2             | 01   | 00              | 2          | 00              |
|               |      | 01, 11          | 1          | 01              |
|               |      |                 |            | 00              |
| 1             |      | 10              | 2          | 00              |
|               |      |                 |            | 10              |
|               |      |                 |            | 00              |

TABLE 3-continued

| Current state | Data | Look-ahead data | Next state | Output codeword |
|---|---|---|---|---|
| 1 | 10 | — | 1 | 00 |
|  |  |  |  | 00 |
|  |  |  |  | 10 |
| 2 |  |  |  | 00 |
|  |  |  |  | 00 |
|  |  |  |  | 00 |
| 1 | 11 | 00 | 2 | 00 |
|  |  | 01, 11 | 1 | 00 |
|  |  |  |  | 01 |
| 2 |  | 10 | 2 | 00 |
|  |  |  |  | 00 |
|  |  |  |  | 10 |

According to Table 3, the decoding table 4 of the decoder can be constructed for the decoder to perform decoding. The X in Table 4 indicates non-emergence.

TABLE 4

| Current codeword | Previous codeword | Next codeword | Output bit |
|---|---|---|---|
| 00<br>01<br>00 | — | — | 01 |
| 00<br>00<br>01 | — | — | 11 |
| 00<br>10<br>00 | — | 00<br>00<br>00 | 01 |
|  | — | 00  00  00  00<br>00, 10, 00, 01<br>01  00  10  00 | 00 |
| 00<br>00<br>10 | — | 00<br>00<br>00 | 11 |
|  | — | 00  00  00  00<br>00, 10, 00, 01<br>10  00  01  00 | 10 |
| 00<br>00<br>00 | 00  00<br>00, 01<br>01  00 | — | 00 |
|  | 00  00<br>10, 00<br>00  10 | — | 10 |
| 00<br>00<br>00 | 00<br>00<br>00 | — | X |

It should be pointed out that: in the above Table 1, when keeping 4 sets of one-dimensional 2-bit data and four 3*2 two-dimensional codewords unchanged, the correspondence between each set of one-dimensional 2-bit data and four 3*2 two-dimensional codewords can be changed. Through simple calculations, there are as many as 24 such correspondences. In other words, the correspondence specified in Table 1 is only one of these 24 correspondences, but once the corresponding relationship between the two is determined, the new basic code table and the new substitute code table that are consistent with the correspondence can be uniquely obtained, and the forms thereof are the same as the basic code table 1 and the substitute code table 2. The basic code table and the substitute code table generated based on this new correspondence will also generate a corresponding unique new encoding table and new decoding table, but the form of the tables is the same as that of the above table 3 and table 4, and the principle is exactly the same.

In the present invention, the second embodiment of the basic code table and the substitute code table is also provided. In the second embodiment, the basic code table is shown in Table 5.

TABLE 5

| Data | Codeword | Data | Codeword |
|---|---|---|---|
| 00 | 00<br>10<br>00 | 10 | 10<br>00<br>00 |
| 01 | 00<br>01<br>00 | 11 | 01<br>00<br>00 |

In the second embodiment, when Table 5 is taken to encode the data, the four counter examples are replaced with the corresponding codeword combination in the substitute code table 6 if the four violations of the two-dimensional square constraint limitation occur.

TABLE 6

| Data | Codeword | Data | Codeword |
|---|---|---|---|
| 0100 | 0000<br>0100<br>0000 | 1100 | 0100<br>0000<br>0000 |
| 0110 | 0000<br>1000<br>0000 | 1110 | 1000<br>0000<br>0000 |

Similarly, according to the above table 5 and table 6, the encoding table 7 can be constructed, and the encoder can perform encoding by looking up Table 7.

TABLE 7

| Current state | Data | Look-ahead data | Next state | Output codeword |
|---|---|---|---|---|
| 1 | 00 | — | 1 | 00 10 00 |
| 2 |  |  |  | 00 00 00 |
| 2 | 01 | 00<br>01, 11 | 2<br>1 | 00 01 00 |
| 1 |  | 10 | 2 | 00 10 00 |
| 1 | 10 | — | 1 | 10 00 00 |
| 2 |  |  |  | 00 00 00 |
| 1 | 11 | 00<br>01, 11 | 2<br>1 | 01 00 00 |
| 2 |  | 10 | 2 | 10 00 00 |

In the second embodiment, the decoding table 8 of the decoder can be constructed according to Table 7 for the decoder to perform the decoding. The X in Table 8 indicates non-emergence.

TABLE 8

| Current codeword | Previous codeword | Next codeword | Output bit |
|---|---|---|---|
| 00 01 00 | — | — | 01 |
| 01 00 00 | — | — | 11 |
| 00 10 00 | — | 00 00 00 | 01 |
| — | — | 01 00 10 00<br>00, 10, 00, 01<br>00 00 00 00 | 00 |
| 10 00 00 | — | 00 00 00 | 11 |
| 00 00 00 | 01 00<br>00, 01<br>00 00 | — | 00 |
| 00 00 00 | 00 10<br>10, 00<br>00 00 | — | 10 |
| 00 00 00 | — |  | X |

On the basis of the above embodiments, the present invention further provides an encoding and decoding device suitable for the above embodiments, comprising an encoding device, a decoding device and a two-dimensional data recording device.

Figure 7:
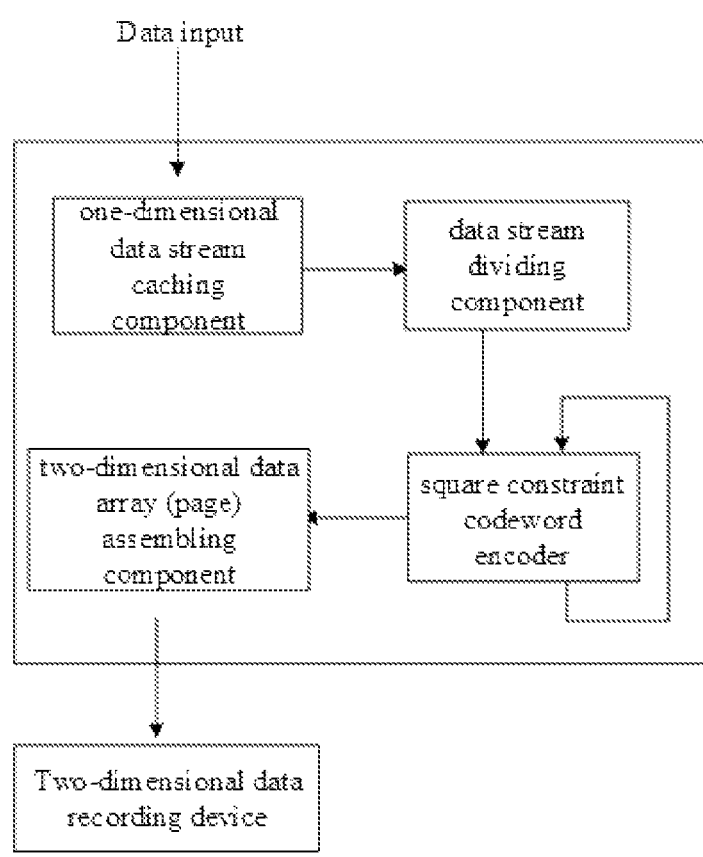
FIG. 7 shows a schematic block diagram of an encoding device principle of the present invention.

As shown in FIG. 7, the encoding device comprises a one-dimensional data stream caching component, a data stream dividing component, a square constraint codeword encoder, and a two-dimensional data array assembling component that are successively connected.

The one-dimensional data stream caching component, which is configured to cache a one-dimensional data stream according to a code rate and the size of a two-dimensional data page.

The data stream dividing component, which is configured to divide the one-dimensional data stream cached by the one-dimensional data stream caching component into several sets of one-dimensional 2-bit data.

The square constraint codeword encoder, which is configured to read several one-dimensional 2-bit data required to complete the encoding from the data stream dividing component, encode each set of 2-bit data into a 3*2 two-dimensional codeword in sequence according to an encoding table of the encoder, and update the current state the encoder in real time.

The two-dimensional data array assembling component, which is configured to cache all two-dimensional codewords generated by the square constraint codeword encoder, and construct a two-dimensional constraint array with a size equal to one page according to the encoding sequence; further configured to output the two-dimensional data of the page constructed to the two-dimensional data recording device. The above encoding sequence is "from left to right, top to bottom".

Figure 8:
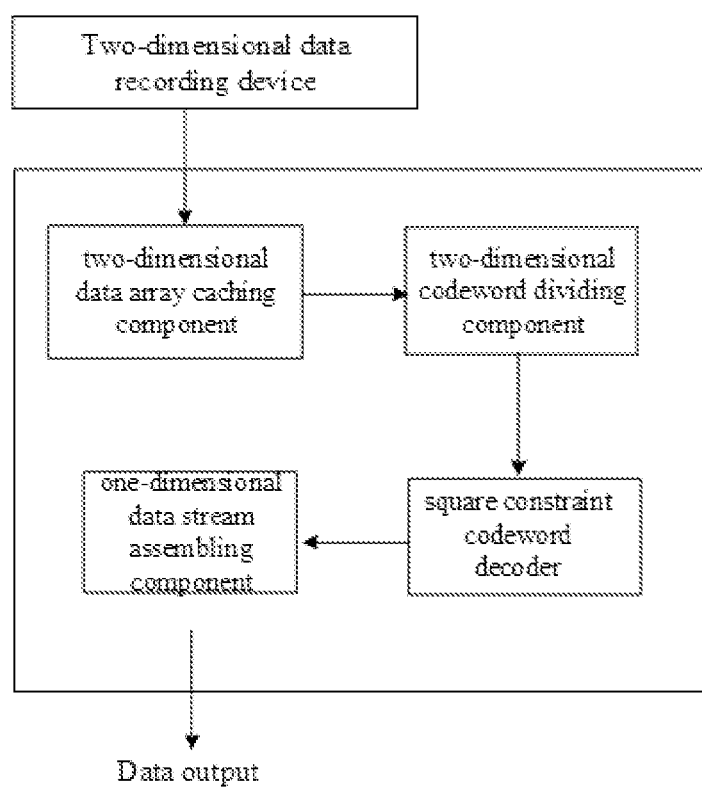
FIG. 8 shows a schematic block diagram of a decoding device principle of the present invention.

As shown in FIG. 8, the decoding device comprises a two-dimensional data array caching component, a two-dimensional codeword dividing component, a square constraint codeword decoder, and a one-dimensional data stream assembly component that are successively connected.

The two-dimensional data array caching component, which is configured to cache a two-dimensional constraint array of a page output by the two-dimensional data recording device.

The two-dimensional codeword dividing component, which is configured to divide the two-dimensional constraint array into several 3*2 two-dimensional codewords in a specified order, and input the two-dimensional codewords into the square constraint codeword decoder in the order of sequence, and the above specified order is "from left to right, top to bottom".

The square constraint codeword decoder, which is configured to decode each two-dimensional codeword into a set of one-dimensional 2-bit data in sequence according to the principle of sliding-block decoding and by taking advantage of the decoding table and in combination with the current two-dimensional codeword, the previous two-dimensional codeword and the next two-dimensional codeword.

The one-dimensional data stream assembling component, which is configured to successively assemble all the one-dimensional 2-bit data output by the square constraint codeword decoder into the one-dimensional data stream for output.

Figure 9:
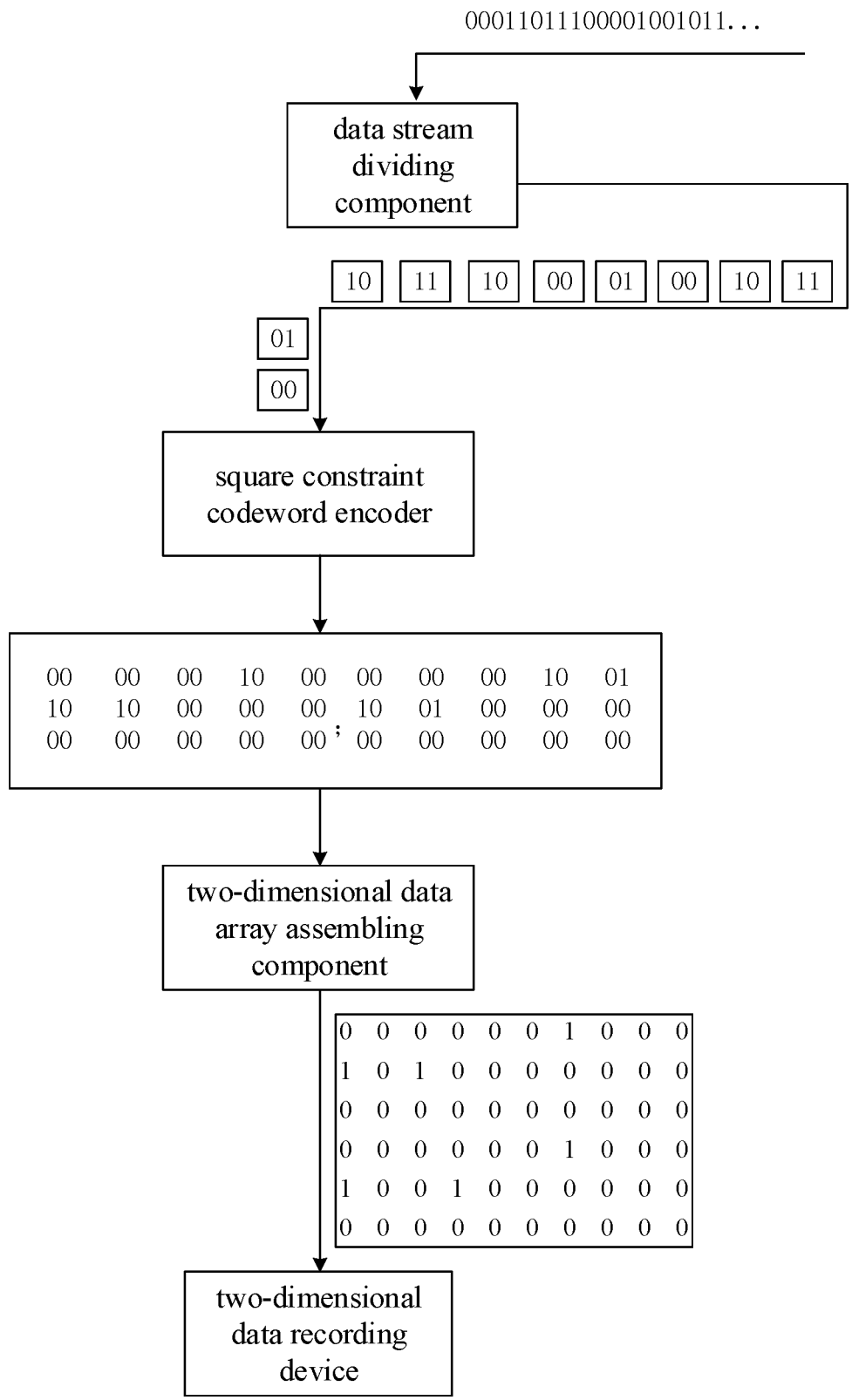
FIG. 9 shows a schematic diagram of a two-dimensional square constraint array encoding of the present invention.

As shown in FIG. 9, based on the second embodiment (i.e. Table 7) of the above encoding and decoding device and the encoding table, the encoding process of the two-dimensional square constraint array is given. Assuming that the size of a two-dimensional data page is 6*10, the one-dimensional random data sequence input to the encoder is 00 01 10 11 10 00 01 00 10 11 (input from left to right), and the initial state of the encoder is the first state (if the initial state is the second state, the analysis is similar). At time the current input data of the encoder is 00, and the next data (look-ahead data) is 01. The encoding is performed according to Table 7. The encoding of the one-dimensional 2-bit data 00 is as follows:

$$00 \to \begin{matrix} 00 \\ 10 \\ 00 \end{matrix}$$

and the next state of the encoder is the first state (i.e. unchanged). At time $t_{i+1}$, the current input data of the encoder is 01, the next data (look-ahead data) is 10, and the current state of the encoder is 1, so the encoding of the current one-dimensional 2-bit data 01 is as follows:

$$00 \to \begin{matrix} 00 \\ 10 \\ 00 \end{matrix}$$

and the next state of the encoder becomes the second state. At time $t_{i+2}$, the current input data of the encoder is 10, and the current state of the encoder is the second state. According to Table 7, the encoding of the current one-dimensional 2-bit data 10 is as follows:

$$10 \to \begin{matrix} 00 \\ 00 \\ 00 \end{matrix}$$

and the next state of the encoder becomes the first state. Repeating the above-mentioned process so as to achieve the encoding of the one-dimensional random data sequence. In the embodiment, the encoding of the subsequent data is as follows:

$$11 \to \begin{matrix} 10 \\ 00 \\ 00 \end{matrix}; 10 \to \begin{matrix} 00 \\ 00 \\ 00 \end{matrix}; 00 \to \begin{matrix} 00 \\ 10 \\ 00 \end{matrix}; 01 \to \begin{matrix} 00 \\ 01 \\ 00 \end{matrix}; 00 \to \begin{matrix} 00 \\ 00 \\ 00 \end{matrix}; 10 \to \begin{matrix} 10 \\ 00 \\ 00 \end{matrix}; 11 \to \begin{matrix} 01 \\ 00 \\ 00 \end{matrix}.$$

During the entire encoding process, the state of the encoder changes to: 1121211111. The encoded data is stored in the two-dimensional data recording device.

Figure 10:
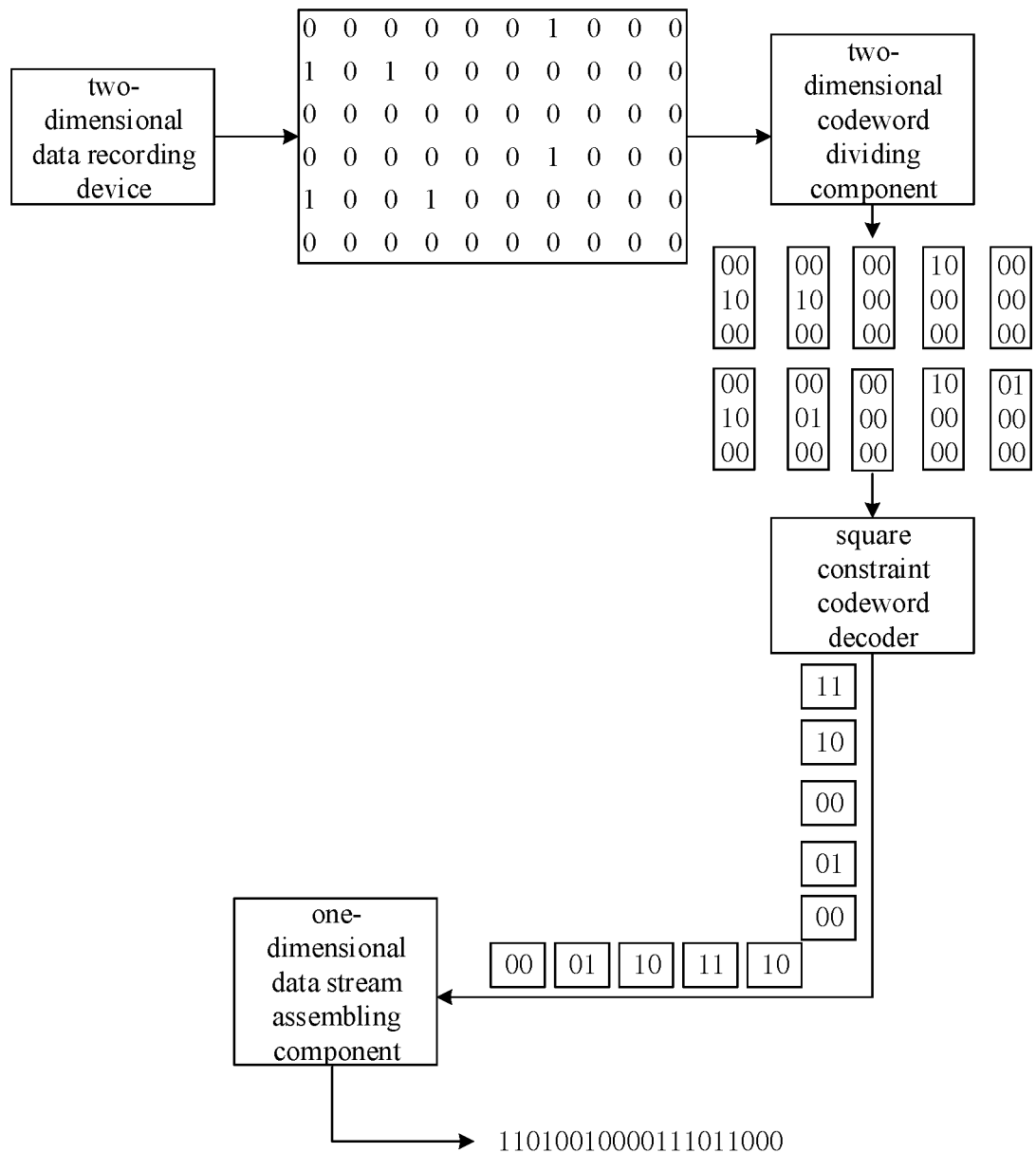
FIG. 10 shows a schematic diagram of a two-dimensional square constraint array decoding of the present invention.

As shown in FIG. 10, the corresponding decoding process is given according to the above-mentioned encoding process. First, the two-dimensional data array is read from the two-dimensional data recording device, and then divided into several the following two-dimensional data sub-arrays according to a set of 3*2.

| 00 | 00 | 00 | 10 | 00 |
|----|----|----|----|----|
| 10 | 10 | 00 | 00 | 00 |
| 00 | 00 | 00 | 00 | 00 |

| 00 | 00 | 00 | 10 | 01 |
|----|----|----|----|----|
| 10 | 01 | 00 | 00 | 00 |
| 00 | 00 | 00 | 00 | 00 |

According to the writing order of the codewords in the two-dimensional array, the two-dimensional data sub-arrays obtained above are input to the decoder in sequence for decoding by taking the 3*2 two-dimensional codewords as the basic unit. At time the current two-dimensional codeword that needs to be decoded by the decoder is $$\begin{matrix} 00 \\ 10 \\ 00 \end{matrix},$$

because the next two-dimensional codeword of the data in the two-dimensional array is $$\begin{matrix} 00 \\ 10 \\ 00 \end{matrix},$$

according to Table 8, the decoding of the data does not require the information of the previous two-dimensional codeword, so the decoding is as follows:

$$\begin{matrix} 00 \\ 10 \\ 00 \end{matrix} \to 00$$

At time $t_{i+1}$, the next two-dimensional codeword of the current two-dimensional codeword $$\begin{matrix} 00 & 00 \\ 10 & \text{is } 00, \\ 00 & 00 \end{matrix}$$

so the current data at time $t_{i+1}$ should be decoded as 01, that is, the decoding is as follows:

$$\begin{matrix} 00 \\ 10 \to 01 \\ 00 \end{matrix}$$

Repeating the above process so as to realize the decoding of the two-dimensional data array, and the decoding of the remaining two-dimensional codewords is as follows:

$$\begin{matrix} 00 & & 10 & & 00 & & 00 \\ 00 \to 10; & 00 \to 11; & 00 \to 10; & 10 \to 00; \\ 00 & & 00 & & 00 & & 00 \end{matrix}$$

$$\begin{matrix} 00 & & 00 & & 10 & & 01 \\ 01 \to 01; & 00 \to 00; & 00 \to 10; & 00 \to 11. \\ 00 & & 00 & & 00 & & 00 \end{matrix}$$

Finally, "00 01 10 11 10 00 01 00 10 11" is assembled into a one-dimensional user data stream 11010010000111011000 (from right to left) according to the generation sequence and output, so that the decoder can decode a page of the two-dimensional data array.

In the above embodiment, the encoder in the encoding device uses a look-ahead data encoding method, that is, the data encoding output is not only directly related to the current data, but also related to the next data and the current state of the encoder. On the other hand, in the decoding stage, in order to decode correctly, the decoder adopts a sliding-block decoding method to decode the current two-dimensional codeword. In short, the decoding output of the two-dimensional codeword is directly related to the current codeword, the previous two-dimensional codeword, and the next two-dimensional codeword. This sliding-block decoding method makes full use of the chronological constraint information between the codewords. Therefore, there is a decoding window for decoding. The size of the decoding window has a significant impact on the catastrophic propagation of decoding errors. However, in the embodiment, although the decoding window is theoretically three codewords, there are only two codewords in fact, so the decoding error does not exceed two data words at most, that is, 4-bit data, which is very advantageous in practical applications.

The present invention is not limited to the above-mentioned embodiments. One skilled in the art may make several improvements and modifications without departing from the principle of the present invention, and these improvements and modifications are also considered to be within the protection scope of the present invention. The contents that are not described in detail in the description belong to the prior art well known by one skilled in the art.

The invention claimed is:

1. A two-dimensional square constraint encoding and decoding method, wherein:
the encoding method comprises: caching a one-dimensional data stream, and dividing the one-dimensional data stream into several sets of one-dimensional 2-bit data; through looking up an encoding table of a two-dimensional square constraint encoder, encoding each set of 2-bit data into a 3*2 two-dimensional codeword in sequence, and constructing all the two-dimensional codewords obtained by encoding into a two-dimensional constraint array with a size equal to one page in an encoding sequence; data "1" being not directly adjacent to each other along four directions of a horizontal direction, a vertical direction, a northeast direction and a southeast direction of the two-dimensional constraint array;
the decoding method comprises: reading the two-dimensional constraint array, and dividing the two-dimensional constraint array into several 3*2 two-dimensional codewords in a specified order, by taking advantage of an internal relationship that the decoding output of the current two-dimensional codeword is not only directly related to the current two-dimensional codeword, but also related to the previous two-dimensional codeword or the next two-dimensional codeword, decoding each two-dimensional codeword into a set of one-dimensional 2-bit data in sequence through looking up a decoding table of a two-dimensional square constraint decoder, and then successively assembling all the one-dimensional 2-bit data into a one-dimensional data stream and outputting.

2. The two-dimensional square constraint encoding and decoding method according to claim 1, wherein the encoder comprises two states, respectively called a first state and a second state; and the encoding basis of the encoding table is:
the 3*2 two-dimensional codeword output by the current encoding is determined by the currently input one-dimensional 2-bit data and the next set of input one-dimensional 2-bit data and the current state of the encoder; the next state of the encoder, which is the output state of the encoder, is determined by the current state of the encoder, the currently input one-dimensional 2-bit data and the next set of input one-dimensional 2-bit data.

3. The two-dimensional square constraint encoding and decoding method according to claim 2, wherein the one-dimensional 2-bit data are respectively 00, 10, 01, and 11, basic two-dimensional codewords are respectively $$\begin{matrix} 00 & 00 & 00 & & 00 \\ 10, & 00, & 01 & \text{and} & 00, \\ 00 & 10 & 00 & & 01 \end{matrix}$$

each set of one-dimensional 2-bit data corresponds to a basic two-dimensional codeword, and the corresponding relationship is set arbitrarily.

4. The two-dimensional square constraint encoding and decoding method according to claim 3, wherein when the one-dimensional 2-bit data of 00, 10, 01 and 11 respectively correspond to the basic two-dimensional codewords of $$\begin{matrix} 00 & 00 & 00 & & 00 \\ 10, & 00, & 01 & \text{and} & 00, \\ 00 & 10 & 00 & & 01 \end{matrix}$$

if the current 2-bit data and the next set of 2-bit data show four conditions as 0100, 1100, 0110 and 1110, the basic two-dimensional codeword combinations corresponding to the current 2-bit data and the next set of 2-bit data should be respectively replaced with the following combinations:

$$\begin{matrix} 0000 \\ 0100 \\ 0000 \end{matrix}, \begin{matrix} 0000 \\ 0000 \\ 0100 \end{matrix}, \begin{matrix} 0000 \\ 1000 \\ 0000 \end{matrix} \text{ and } \begin{matrix} 0000 \\ 0000 \\ 1000 \end{matrix}.$$

5. The two-dimensional square constraint encoding and decoding method according to claim 4, wherein the encoding table of the encoder is:

| Current state | Data | Look-ahead data | Next state | Output codeword |
|---|---|---|---|---|
| 1 | 00 | — | 1 | 00 10 00 |
| 2 |  |  |  | 00 00 00 |
| 2 | 01 | 00 01, 11 | 2 1 | 00 01 00 |
| 1 |  | 10 | 2 | 00 10 00 |
| 1 | 10 | — | 1 | 00 00 10 |
| 2 |  |  |  | 00 00 00 |
| 1 | 11 | 00 01, 11 | 2 1 | 00 00 01 |
| 2 |  | 10 | 2 | 00 00 10. |

6. The two-dimensional square constraint encoding and decoding method according to claim 5, wherein the decoding table of the decoder is:

| Current codeword | Previous codeword | Next codeword | Output bit |
|---|---|---|---|
| 00 01 00 | — | — | 01 |
| 00 00 01 | — | — | 11 |
| 00 10 00 | — | 00 00 00 | 01 |
| — | — | 00 00 00 00, 10, 00, 01 01 00 10 00 | 00 |
| 00 00 10 | — | 00 00 00 | 11 |
| — | — | 00 00 00 00, 10, 00, 01 10 00 01 00 | 10 |
| 00 00 00 | 00 00 00, 01 01 00 | — | 00 |
|  | 00 00 10, 00 00 10 | — | 10 |
| 00 00 00 | — | — | X | wherein X indicates non-emergence.

7. The two-dimensional square constraint encoding and decoding method according to claim 2, wherein the one-dimensional 2-bit data are respectively 00, 10, 01 and 11, basic two-dimensional codewords are respectively $$\begin{matrix} 00 \\ 10 \\ 00 \end{matrix}, \begin{matrix} 10 \\ 00 \\ 00 \end{matrix}, \begin{matrix} 00 \\ 01 \\ 00 \end{matrix} \text{ and } \begin{matrix} 01 \\ 00 \\ 00 \end{matrix},$$

each one-dimensional 2-bit data corresponds to a basic two-dimensional codeword, and the corresponding relationship is set arbitrarily.

8. The two-dimensional square constraint encoding and decoding method according to claim 7, wherein when the one-dimensional 2-bit data of 00, 10, 01 and 11 respectively correspond to the basic two-dimensional codewords of $$\begin{matrix} 00 & 10 & 00 & 01 \\ 10, & 00, & 01 \text{ and } & 00, \\ 00 & 00 & 00 & 00 \end{matrix}$$

if the current 2-bit data and the next set of 2-bit data show four conditions as 0100, 1100, 0110 and 1110, the basic two-dimensional codeword combinations corresponding to the current 2-bit data and the next set of 2-bit data should be respectively replaced with the following combinations:

$$\begin{matrix} 0000 & 0100 & 0000 & 1000 \\ 0100, & 0000, & 1000 \text{ and } & 0000. \\ 0000 & 0000 & 0000 & 0000 \end{matrix}$$

9. The two-dimensional square constraint encoding and decoding method according to claim 8, wherein the encoding table of the encoder is:

| Current state | Data | Look-ahead data | Next state | Output codeword |
|---|---|---|---|---|
| 1 | 00 | — | 1 | 00<br>10<br>00 |
| 2 | | | | 00<br>00<br>00 |
| 2 | | 00<br>01, 11 | 2<br>1 | 00<br>01<br>00 |
| 1 | 10 | | 2 | 00<br>10<br>00 |
| 1 | 10 | — | 1 | 10<br>00<br>00 |
| 2 | | | | 00<br>00<br>00 |
| 1 | 11 | 00<br>01, 11 | 2<br>1 | 01<br>00<br>00 |

| Current state | Data | Look-ahead data | Next state | Output codeword |
|---|---|---|---|---|
| 2 | | 10 | 2 | 10<br>00<br>00. |

10. The two-dimensional square constraint encoding and decoding method according to claim 9, wherein the decoding table of the decoder is:

| Current codeword | Previous codeword | Next codeword | Output bid |
|---|---|---|---|
| 00<br>01<br>00 | — | — | 01 |
| 01<br>00<br>00 | — | — | 11 |
| 00<br>10<br>00 | — | 00<br>00<br>00 | 01 |
| | — | 01 00 10 00<br>00, 10, 00, 01<br>00 00 00 00 | 00 |
| 10<br>00<br>00 | — | 00<br>00<br>00 | 11 |
| | — | 01 00 10 00<br>00, 10, 00, 01<br>00 00 00 00 | 00 |
| 00<br>00<br>00 | 01 00<br>00, 01<br>00 00 | — | 00 |
| | 00 10<br>10, 00<br>00 00 | — | 10 |
| | 00<br>00<br>00 | — | X | wherein X indicates non-emergence.

11. The two-dimensional square constraint encoding and decoding method according to claim 1, wherein in the encoding method, cascading the two-dimensional codewords obtained by encoding from left to right and from top to bottom;

in the decoding method, dividing the two-dimensional constraint array into several 3*2 two-dimensional codewords from left to right and from top to bottom;

and the decoder decodes the current two-dimensional codeword in sequence through using a sliding-block decoding method.

12. An encoding and decoding device suitable for the encoding and decoding method of claim 1, wherein the encoding device comprises:
a one-dimensional data stream caching component, which is configured to cache a one-dimensional data stream according to a code rate and the size of a two-dimensional data page;
a data stream dividing component, which is configured to divide the one-dimensional data stream cached by the one-dimensional data stream caching component into several sets of one-dimensional 2-bit data;
a square constraint codeword encoder, which is configured to read the one-dimensional 2-bit data from the data stream dividing component, and encode each set of 2-bit data into a 3*2 two-dimensional codeword in sequence according to an encoding table;
a two-dimensional data array assembling component, which is configured to cache all two-dimensional codewords generated by the square constraint codeword encoder, and cascade from left to right and from top to bottom according to the encoding sequence to construct a two-dimensional constraint array with a size equal to one page; further configured to output the two-dimensional data of the page constructed to a two-dimensional data recording device;

the decoding device comprises:
a two-dimensional data array caching component, which is configured to cache a two-dimensional constraint array of the page output by the two-dimensional data recording device;
a two-dimensional codeword dividing component, which is configured to divide the two-dimensional constraint array into several 3*2 two-dimensional codewords in a specified order;
a square constraint codeword decoder, which is configured to, according to the principle of sliding-block decoding, by taking advantage of an internal relationship that the decoding output of the current two-dimensional codeword is not only directly related to the current two-dimensional codeword, but also related to the previous two-dimensional codeword or the next two-dimensional codeword, decode each two-dimensional codeword into a set of one-dimensional 2-bit data in sequence through looking up the decoding table of the two-dimensional square constraint decoder;
a one-dimensional data stream assembling component, which is configured to successively assemble all the one-dimensional 2-bit data output by the square constraint codeword decoder into the one-dimensional data stream for output.

* * * * *